United States Patent [19]

Monticelli

[11] 4,065,668

[45] Dec. 27, 1977

[54] PHOTODIODE OPERATIONAL AMPLIFIER

[75] Inventor: Dennis M. Monticelli, Fremont, Calif.

[73] Assignee: National Semiconductor Corporation, Santa Clara, Calif.

[21] Appl. No.: 707,745

[22] Filed: July 22, 1976

[51] Int. Cl.$^2$ .............................................. H01J 39/12
[52] U.S. Cl. .................................. 250/214 P; 307/311
[58] Field of Search ........... 250/214 A, 214 C, 214 P; 307/311, 297

[56] References Cited

U.S. PATENT DOCUMENTS

| | | | |
|---|---|---|---|
| 3,734,632 | 5/1973 | Matsuda | 250/214 C |
| 3,770,968 | 11/1973 | Hession | 307/311 |
| 3,801,933 | 4/1974 | Teare | 250/214 A |
| 3,850,809 | 11/1974 | Mannonen | 250/214 A |

Primary Examiner—M. Tokar

Attorney, Agent, or Firm—Gail W. Woodward; Willis E. Higgins

[57] ABSTRACT

A pair of field effect transistors are series connected with one acting as a current source to bias the second which acts as a source follower. A photodiode, connected between the source follower gate and source, operates in response to light to change the current in the source follower. The photodiode is biased by the collector of a bipolar transistor that is connected as a negative feedback amplifier operating around the source follower stage. This configuration maintains close to zero bias on the photodiode, particularly at low light levels, and ensures that the collector current in the bipolar transistor equals the photocurrent. An output bipolar transistor with an uncommitted collector matches the feedback transistor and has its emitter and base directly connected thereto. Thus the output current will track the photocurrent, which is a linear function of light input over a very large range of levels. The circuit is linearly operative to extremely low light levels.

8 Claims, 2 Drawing Figures

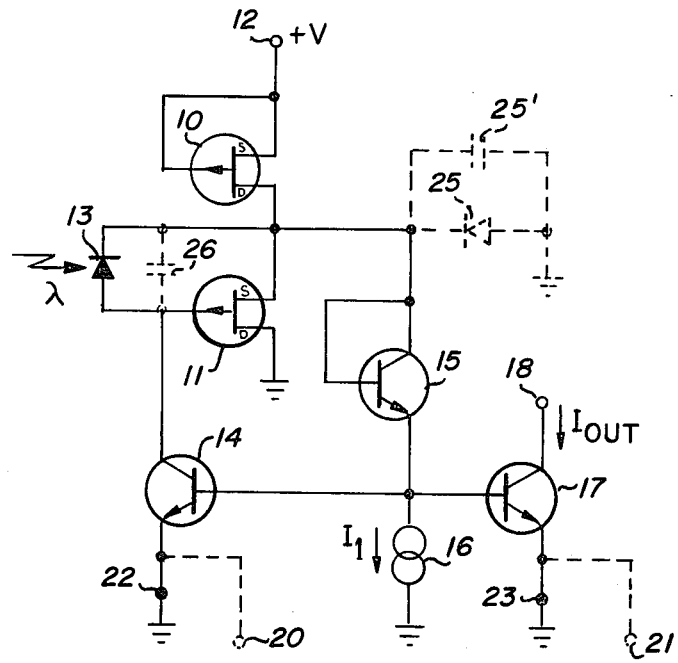
Fig_1
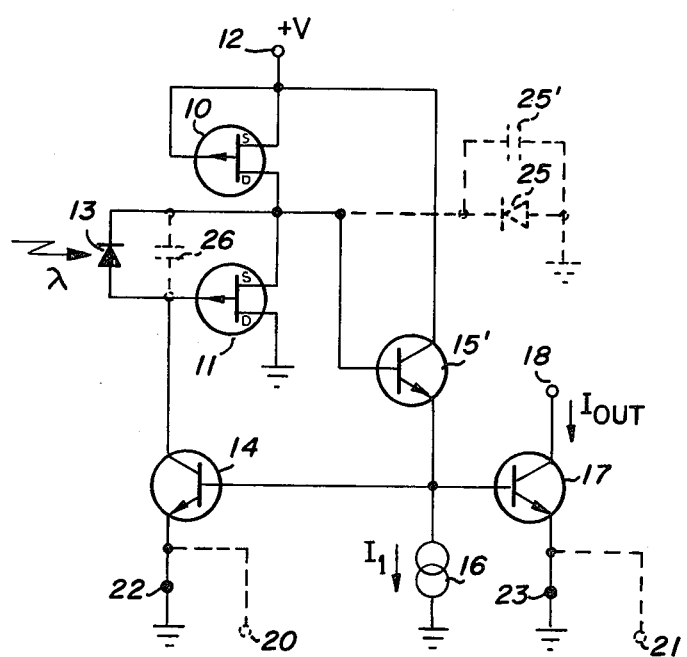
Fig_2

PHOTODIODE OPERATIONAL AMPLIFIER

BACKGROUND OF THE INVENTION

The invention is related to circuitry that is associated with photosensitive elements. While the circuitry is useful generally in light sensing and measuring, it is mainly of interest in photographic applications.

In the area of photography, automatic cameras employ light sensors that regulate the shutter and/or lens opening to control film exposure. Such a system should be capable of operating under full sunlight, or about 1500 foot candles of sky illumination, to a dimly lit scene at about 0.02 foot candle or even less. Thus the photosensor should function over about five orders of magnitude and desirably the response should be linear. Since flash exposure is often used on cameras, the photo sensor should have a response time that is fast enough to react to an electronic flash as well as the more common flash bulb. The former device typically emits light pulses having a duration in the millisecond or less region.

Photoelectric light sensors have been available for many years and the practice has developed of using a particular device for a particular light level and/or application. Photometry in particular has advanced with the evolution of many different types of devices. For example, when very low light levels are to be sensed, cadmium sulfide cells are often used. While they are very sensitive, they are nonlinear and slow to respond to changes in light and in addition possess an undesirable "memory" of previous high light level. A sensitive cadmium sulfide cell might respond to an electronic flash, but its response would be greatly reduced as a function of the flash speed and the elapsed time from the preceding flash. Selenium has long been used because it is self-generating and moderately fast, but it will not operate well at very low light levels and such cells are typically very large. Silicon is an excellent photoresponsive material. Its response to changes in illumination is very rapid and linear. It will respond to very intense light levels and, while it will respond linearly down to very low light levels, the photo current at low level is so small as to be very difficult to be sensed or measured. Therefore, while silicon is probably one of the best overall photosensitive materials and is quite amenable to device fabrication, its use has been curtailed substantially because of a lack of suitable associated circuitry.

SUMMARY OF THE INVENTION

It is an object of the invention to provide a circuit for use with a silicon photosensor that responds linearly to a great range of light levels.

It is a further object of the invention to employ a silicon photosensor in a monolithic silicon integrated circuit (IC) suitable for camera control applications.

It is a feature of the invention that a silicon photosensor can be fabricated into an IC while an associated amplifier is being constructed, the combination having electrical properties useful in camera control.

These and other objects and features are achieved using a novel circuit configured as follows. A pair of junction field effect transistors (JFETs) are series connected across the terminals of a power supply. They are matched and configured to have a low (about one volt) pinch off or $V_p$. One JFET has its gate connected to its source so that it operates as a current source. The other JFET is connected as a source follower amplifier using the current source as a load element. A silicon photodiode is coupled between gate and source of the source follower so that conduction in the source follower is a function of illumination. A bipolar transistor has its collector coupled to the source follower gate to bias the photodiode and the base is direct coupled, through suitable level change, to the source of the source follower. The bipolar transistor acts as a high gain negative feedback element around the source follower to set the operating point at exactly that value that makes the bipolar transistor collector current equal to the photo current. The photo diode is biased at close to zero voltage, particularly at low light levels, so that very weak photocurrents can be sensed without encountering leakage current. The maximum light level to be sensed is determined by the photodetector area and the conduction of the current source JFET.

An output stage comprising a bipolar transistor that matches the biasing device has its base and emitter directly coupled thereto. An uncommitted collector can then be connected to pass a current that is a replica of the photo current.

The circuit of the invention operates over a very great range of illumination levels, is linear over the range, and has a very fast response to changes in illumination. In addition, the circuit can very quickly be energized so that it can be turned of when not in use.

BRIEF DESCRIPTION OF THE DRAWING

FIG. 1 is a schematic diagram of the circuit of the invention; and

FIG. 2 is a schematic diagram of an alternate embodiment of the circuit of FIG. 1.

DESCRIPTION OF THE INVENTION

The circuit shown in FIG. 1 is constructed around a pair of depletion mode JFETs 10 and 11 series connected between one terminal of a source of potential 12 labeled +V and ground which constitutes the second terminal of the source potential. These JFETs are matched in terms of area and pinch off potential $V_p$. This can readily be achieved by making them simultaneously, using well-known JFET-bipolar compatible IC fabrication techniques and by making their areas equal. Desirably $V_p$ is kept low — in the range of one volt or less.

Since the gate of JFET 10 is returned to its source, it will operate as a current source for source to drain potentials in excess of about a volt. For the following discussion, a limiting current of about 100 microamperes will be assumed although other values could be used. Furthermore, since JFETs 10 and 11 are in series, the same current (neglecting other circuit elements) will flow therethrough. For this condition, the potential of the gate JFET 11 will be at its source potential. This means that photodiode 13, connected directly between gate and source, will operate at essentially zero potential.

Transistor 14 and level shift diode 15 complete a feedback loop around JFET 11. Diode 15 is actually obtained from a transistor with its collector connected to the base. Transistor 14 has its collector connected to the gate of JFET 11 so that any current that flows in photodiode 13 flows as collector current in transistor 14. This is required to provide a means of extracting the photocurrent for eventual replication in transistor 17.

The base of transistor 14 operates at one diode drop below the potential of the source of JFET 11, which operates as a high gain source follower stage. JFET 10, operating as a current source, acts as the source load for JFET 11.

In order to make sure that diode 15 is conductive, a small current, $I_1$, on the order of less than one microampere, is drawn by current source 16. This current "bleed" enhances the speed of the feedback loop by raising the $f_T$ of diode-connected transistor 15 and aiding in turning transistors 14 and 17 off under low light level conditions. Since this current is less than 1% of the current in JFET 10, it will therefore have little effect otherwise.

The direct-coupled feedback loop around source follower JFET 11 involves a single inversion through transistor 14 and is therefore negative. This negative feedback loop will cause the potential at the gate of JFET 11 to seek a value that will adjust its conduction to where the current passing through JFET 11 plus the combined currents of photodiode 13 and diode 15 exactly equal the current through JFET 10. This condition will occur when the potential at the source of JFET 11 is at about one volt (very close to $Vp$). Thus +V is at about two volts or greater.

The one volt level is established to ensure that JFET 11 is operated in its saturated region. As explained above, the exact voltage will self adjust until the circuit is stabilized. For this condition, it can be seen that the current in photodiode 13 equals the collector current of transistor 14.

Under dark conditions, the current in photodiode 13 is in the picoampere range, an exceptionally small value. However, such a small value can be realized in practice with a reasonably sized structure because the photodiode is operated at essentially zero voltage. This means that leakage currents are minimized.

When photodiode 13 is illuminated, it produces a photo current that flows in the collector of transistor 14 with the feedback circuit action adjusting the bias on the transistor 14 to set its conduction level. Since most of the total current still flows in JFET 11, the potential at its gate and source changes only slightly. Photodiode 13 is still at essentially zero bias.

As illumination increases still further, and more current flows in photodiode 13, the photo response will be extremely linear and will always be equal to the collector current in transistor 14. This action can continue until the photodiode 13 current approaches the current flowing in JFET 10, at which time the current in JFET 11 approaches zero and the voltage across the photodiode approaches a level sufficient to forward bias the photodiode. This level was established by the size of JFET 10 at about 100 microamperes. Thus the circuit will be linear over the range of from about 100 picoamperes to about 10 microamperes. This covers a range of 100,000 to 1.

If photodiode 13 is designed to produce about 7.5 microamperes in bright skylight (about 1500 foot candles of illumination), it will produce about 100 picoamperes at an illumination of only 0.02 foot candle. Such performance can readily be achieved using conventional IC fabrication techniques to construct the circuit shown.

Transistor 14 is desirably a high quality, low leakage IC device. It has been found that even at collector current values of around one nanoampere, transistors can be readily constructed having base to collector current gain values of 20 to 80. This means a base current of no more than 50 picoamperes. This very low current level explains why source 16 is present to ensure a nominal foward bias current in diode 15. With a current gain of 20 for transistor 14 and the near unity gain characteristic of JFET 11, the feedback loop gain is quite adequate to fully stabilize circuit operation even at the lowest light levels. Proper replication of the photocurrent in transistor 17 requires only that the alpha's (or Beta's) of transistors 14 and 17 be matched. Low values of Beta will be accounted for by the action of the feedback loop.

Transistor 17 is constructed to match transistor 14 and has common connected emitter and base with a separate uncommitted collector connection 18. In practice, a load or utilization device can be connected to terminal 18 and returned to some source of positive potential which can be equal to or much higher than +V if desired. Clearly the current flowing in photodiode 13 will be equal to the collector currents of both transistors 14 and 17, and the load connected to terminal 18 will have no effect upon the circuit operation provided that the collector breakdown voltage of transistor 17 is not exceeded.

If desired, the output current at terminal 18 can be ratioed to the photocurrent. To do this, the relative emitter area of transistors 14 and 17 can be scaled. However, this ratio would be fixed in the IC. Alternatively, the emitters of transistors 14 and 17 are brought out to separate terminals 20 and 21 as shown by the dashed lines. To do this, the ground connection would be broken at points 22 and 23. Either or both emitters can be brought out as shown. If the emitter of transistor 14 is returned to a potential that is slightly positive with respect to that of the emitter of transistor 17, by conventional means not shown, the current at terminal 18 will be greater than the photodiode 13 current. As a practical matter, scaling ratios of 1000 to 1 can be achieved by employing potential differences at terminals 20 and 21 of a few hundred millivolts. If terminal 21 is made slightly positive with respect to terminal 20, the current at terminal 18 will be scaled down to a fraction of the current in photodiode 13. Should the external emitter voltage option be exercised, care should be taken to insure that the applied voltage is of the proper temperature to match that of the $\Delta V_{BE}$ thus created.

FIG. 2 shows a modified circuit. The diode 15 of FIG. 1 has been converted to an emitter follower stage 15'. This configuration provides the desired level shift between the source of JFET 11 and the base of transistor 14. It also provides for close to unity gain with no phase inversion between these two points so that the circuit operation is essentially as described above. However, since the collector of transistor 15' is returned to +V, its emitter can supply substantial current to the bases of transistors 14 and 17 if the situation demands. For example, where the current of transistor 17 is ratioed, as described, to a value that is large relative to photocurrent, the output current might require a base current in transistor 17 that exceeds that available from the source of JFET 11. The emitter follower action of transistor 15' provides a current gain from its base to its emitter and can thus supply the current needed at the base of transistor 17.

As was pointed out above, JFETs 10 and 11 conduct and at the lower light levels most of the current flowing in JFET 10 flows in JFET 11. Since the feedback loop is of high gain, the source of JFET 11 represents a low impedance signal node in the circuit. This is highly advantageous in circuit operation with respect to stray capacitance and leakage. Diode 25, shown in dashed outline, will have a reverse leakage current and represents the major source of stray or parasitic capacitance shown as 25'. When using conventional junction isolated IC fabrication, diode 25 would represent the epitaxial to substrate junction of an isolated region carrying photodiode 13. The leakage of diode 25 would be small relative to the current in JFET 10 and will thus have substantially no effect upon the circuit performance. In order for the circuit to respond rapidly to a light transient, capacitance 25' must charge and/or discharge. However, since it appears at a low impedance circuit node, the source of source follower JFET 11, such charging and discharging is quite rapid. For example, the circuit can readily resolve the transient produced by a conventional electronic flash unit which produces a one millisecond duration burst of light.

Another stray capcitance, shown in dashed outline, is capacitor 26. This is the capacitance of the PN junction of photodiode 13. Since the photodiode is made sufficiently large to generate the desired photo current and since the device operates at low potential, this capacitance can be substantial (on the order of 30 picofarads in a typical device). Under prior art circuit conditions, particularly using photo conductor operation, such stray capacitance can seriously impair photodiode transient performance. However, using the circuit of the invention, the photodiode is connected between the source and gate of a source follower JFET. Any circuit transient action occurs between the unity gain circuit points and, if anything, the junction capacitance 25' will assist the transient circuit response action rather than degrade it by "feeding forward" high frequency signals aroung JFET 11.

Another circuit characteristic relates to so called "power up." Under ordinary conditions, it is desirable to leave the circuit turned of or unpowered when it is not in use. In the camera application, actuating the shutter release causes the circuit to power up and it must be ready to function by the time the shutter itself is operated. Since the circuit uses a pair of series JFETs 10 and 11 which are depletion mode devices connected in series between +V and ground, the circuit is self starting. Also when the +V is first applied to the circuit, the high gain feedback loop described above will cause the circuit to stabilize very quickly. In a typical IC version of the circuit and at low light level, the operating level was found to stabilize in less than 10 microseconds.

A very simple circuit using conventional IC elements that can easily be fabricated with a JFET-bipolar compatible process has been described. The novel circuit has extremely linear photo response from full skylight down to very low light levels. Transient and power up response is very fast and the circuit operates at supply levels down to about two volts at about 100 microamperes — a level attractive for battery operation. Circuit performance is relatively independent of voltage above the two volt level with any excess over two volts manifesting itself only as a small offset voltage or non-zero condition across the photodiode. The output can be made equal to photodiode current or can be scaled up or down with ease. Clearly alternatives or equivalents will occur to a person skilled in the art. Accordingly, it is intended that my invention be limited only by the following claims.

I claim:

1. A composite JFET bipolar transistor photo responsive electronic circuit comprising:
   a P-N junction photodiode;
   negative feedback means, including a source follower connected JFET having a matched constant current connected JFET as a source load, for maintaining the potential across said photodiode at substantially zero under dark conditions; and
   means for replicating the photo current generated in said photodiode in the collector of a bipolar transistor coupled to said photodiode.

2. The circuit of claim 1 wherein said bipolar transistor has a base element coupled to said source follower whereby said bipolar transistor provides a negative feedback action around said source follower.

3. The circuit of claim 2 wherein said bipolar transistor base is coupled to said source follower by means of a level shifting diode.

4. A photo electric circuit comprising:
   means for coupling said circuit to a source of supply voltage having first and second terminals;
   first and second JFETs, each having source, drain, and gate electrodes, means coupling said source and gate of said first JFET to said first supply terminal, means coupling said drain of said first JFET to said source of said second JFET and means coupling said drain of said second JFET to said second supply terminal;
   a first bipolar transistor having emitter, base and collector electrodes, means coupling said collector to said gate of said second JFET and means coupling said emitter to said second supply terminal;
   a level shifting diode having a pair of terminals poled for forward conduction coupled between said base of said first bipolar transistor and said source of said second JFET, and
   a photo responsive diode having a pair of terminals coupled between said gate and said source electrodes of said second JFET and poled for forward conduction of said collector current of said first bipolar transistor, wherein said collector current of said first bipolar transistor is linearly proportional to the intensity of light illuminating said photo responsive diode.

5. The circuit of claim 4 further comprising:
   a second bipolar transistor having an emitter coupled to said second supply terminal, a base coupled to said base of said first bipolar transistor, and a collector terminal adapted for coupling to an external load element, said second bipolar transistor being matched to said first bipolar transistor whereby said current in said external load is a replica of the photo current in said photo responsive diode.

6. The circuit of claim 5 further comprising:
   a current source coupled between said bases of said bipolar transistors and said second supply terminal, said current source having a current sourcing value that is small relative to the current flowing in said first JFET.

7. The circuit of claim 6 further comprising:
   means for ratioing the currents flowing in said first and second bipolar transistors.

8. The circuit of claim 7 wherein said level shifting diode is the emitter-base diode of a bipolar transistor having a collector coupled to said first supply terminal.

* * * * *